US010547096B2

(12) United States Patent
Bates

(10) Patent No.: US 10,547,096 B2
(45) Date of Patent: Jan. 28, 2020

(54) MICROWAVE CAVITY RESONATOR STABILIZED OSCILLATOR

(71) Applicant: Knowles Cazenvovia, Inc., Cazenovia, NY (US)

(72) Inventor: David Bates, Fayetteville, NY (US)

(73) Assignee: Knowles Cazenovia, Inc., Cazenovia, NY (US)

(*) Notice: Subject to any disclaimer, the term of this patent is extended or adjusted under 35 U.S.C. 154(b) by 40 days.

(21) Appl. No.: 15/851,060

(22) Filed: Dec. 21, 2017

(65) Prior Publication Data

US 2018/0183130 A1    Jun. 28, 2018

Related U.S. Application Data

(60) Provisional application No. 62/438,358, filed on Dec. 22, 2016.

(51) Int. Cl.
*H01P 7/06* (2006.01)
*H03B 5/18* (2006.01)
(Continued)

(52) U.S. Cl.
CPC .............. *H01P 7/065* (2013.01); *H03B 1/02* (2013.01); *H03B 5/1823* (2013.01);
(Continued)

(58) Field of Classification Search
CPC .. H01P 7/06; H01P 7/065; H03B 5/18; H03B 5/1817; H03B 5/1823; H03B 5/1829;
(Continued)

(56) References Cited

U.S. PATENT DOCUMENTS 3,173,108 A * 3/1965 Kawahashi .............. H03B 5/18
                                                                330/43
3,781,706 A    12/1973 Osborne et al.
(Continued)

FOREIGN PATENT DOCUMENTS

| AU | 498926 B2 | 3/1979 |
| EP | 0 475 262 A1 | 3/1992 |
| EP | 0 480 494 A1 | 4/1992 |

OTHER PUBLICATIONS

Cassivi et al., "Low cost microwave oscillator using substrate integrated wavelength cavity," IEEE Microwave and Wireless Components Letters, vol. 13, No. 2, pp. 48-50 (Feb. 28, 2003).
(Continued)

*Primary Examiner* — Levi Gannon
(74) *Attorney, Agent, or Firm* — Foley & Lardner LLP

(57) ABSTRACT

Methods, systems, and apparatuses, including computer programs encoded on computer-readable media, for a microwave cavity resonator stabilized oscillator, are described. The oscillator can include a cavity resonator configured to resonate at least at one predetermined resonant frequency in a GHz frequency range. The oscillator can include circuitry including a microwave amplifier, a low pass filter and a phase shifter. The circuitry may be arranged in a feedback loop configuration, and may be at least partially mounted above a first surface of the cavity resonator. The circuitry may be electrically coupled to the cavity resonator to form an oscillator. The circuitry can include a first delay line segment that is selected instead of at least one other delay line segments for wire-bond connection to complete the feedback loop configuration at zero degree phase.

20 Claims, 7 Drawing Sheets

(51) Int. Cl.
*H03H 11/26* (2006.01)
*H03H 11/20* (2006.01)
*H03B 1/02* (2006.01)

(52) U.S. Cl.
CPC ........... *H03H 11/20* (2013.01); *H03H 11/265* (2013.01); *H03B 2200/002* (2013.01); *H03B 2200/0028* (2013.01)

(58) Field of Classification Search
CPC .... H03B 5/1864; H03B 5/187; H03B 5/1876; H03B 2200/002; H03B 2200/0028
USPC .......... 331/96, 107 DP; 333/219, 219.1, 227
See application file for complete search history.

(56) References Cited

U.S. PATENT DOCUMENTS

| | | | | |
|---|---|---|---|---|
| 4,121,941 | A * | 10/1978 | Kawashima | C04B 35/495 333/219.1 |
| 4,511,860 | A * | 4/1985 | Bastida | H01P 7/10 331/107 SL |
| 4,713,632 | A | 12/1987 | Nishikawa et al. | |
| 5,032,800 | A * | 7/1991 | Galani | H03B 5/1882 331/1 R |
| 5,036,299 | A * | 7/1991 | Dick | H03B 5/1864 331/135 |
| 5,150,080 | A * | 9/1992 | Bianchini | H03B 5/1864 331/117 D |
| 5,324,713 | A * | 6/1994 | Shen | H01P 7/10 333/202 |
| 5,841,322 | A * | 11/1998 | Ivanov | G01R 29/26 331/1 R |
| 6,549,104 | B1 * | 4/2003 | Ghosh | H01P 7/06 331/107 DP |
| 7,046,099 | B2 * | 5/2006 | Ivanov | H03B 5/04 331/176 |
| 9,000,851 | B1 | 4/2015 | Oran et al. | |
| 2003/0062963 | A1 | 4/2003 | Aikawa et al. | |
| 2005/0007204 | A1 * | 1/2005 | Howe | H03B 5/1817 331/107 DP |
| 2006/0097807 | A1 * | 5/2006 | Mage | H01P 7/10 331/107 DP |
| 2009/0273404 | A1 | 11/2009 | Hay | |

OTHER PUBLICATIONS

Cassivi et al., "Low-cost and High-Q millimeter-wave resonator using substrate integrated wavelength technique," 32nd European Microwave Conference, pp. 1-4 (Sep. 23, 2002).
International Search Report and Written Opinion, PCT/US2017/068015, Knowles Electronics, LLC, 13 pages (dated Apr. 10, 2018).
Liang Zhou et al., "Dielectric resonators with high Q-Factor for tunable low phase noise oscillators," IEEE Transactions on Components, Packaging and Manufacturing Technology, vol. 3, No. 6, pp. 1008-1015 (Jun. 30, 2013).

* cited by examiner

MICROWAVE CAVITY RESONATOR STABILIZED OSCILLATOR

CROSS REFERENCE TO RELATED APPLICATIONS

This application claims priority to U.S. Provisional Patent Application No. 62/438,358, entitled "MICROWAVE CAVITY RESONATOR STABILIZED OSCILLATOR," filed on Dec. 22, 2016, and assigned to the assignee hereof and hereby expressly incorporated by reference herein.

BACKGROUND

The following description is provided to assist the understanding of the reader. None of the information provided or references cited is admitted to be prior art.

Electronic resonators are used in a variety of electronic circuits to perform a variety of functions. Depending upon the structure and material of the resonator, when an alternating current (AC) signal is applied to the resonator over a broad frequency range, the resonator can resonate at specific resonant frequencies. This characteristic allows the resonator to be used, for example, in an electronic filter that is designed to pass only frequencies in a preselected frequency range, or to attenuate specific frequencies.

Resonators are also used in high frequency applications, such as optical communication systems which operate in the gigahertz (GHz) range. In these types of applications, resonators are used, for example, to stabilize the frequency of oscillators in repeater modules that are provided along an optical communication transmission line. These types of resonators exhibit high quality factor (Q or Q factor) values in order to provide the necessary oscillator frequency stability and spectral purity, and also maintain low phase noise. Q factor is a parameter that describes how under-damped an oscillator or resonator is. For instance, a higher Q value indicates a lower rate of energy loss relative to the stored energy of the resonator, and the oscillations die out more slowly.

There are several types of such high Q resonators. For example, cavity resonators, coaxial resonators, transmission line resonators and dielectric resonators have all been used in high Q applications. Cavity and dielectric resonators, however, are difficult to mass produce in an efficient manner, because these devices consist of machined parts. There is also significant manual labor involved in assembling the devices and mounting them to circuit boards, as well as in tuning the devices to the desired resonant frequency.

Ceramic coaxial resonators are also relatively expensive to mass produce as they are individually machined and tested to achieve the desired resonant frequency. In surface mount applications, these are typically limited to operating at frequencies less than 5 GHz due to dimensions, parasitics and spurious modes.

Transmission line resonators, typically microstripline, can be fabricated along with interconnection traces on a printed circuit board. This technique can provide only low performance resonators. They are low Q, typically <80, and have poor frequency stability with changing temperature resulting from material properties and geometry. Microstripline resonators are also inherently un-shielded and therefore affected by materials and components in proximity to them. Moreover, transmission line resonators are typically large in size, which is a serious issue in the constant drive to miniaturize electronic components.

Dielectric resonators take the shape of a disc or cylinder. Typical 2 GHz dielectric resonators are about one inch in diameter and one-half inch high. Typical 10 GHz dielectric resonators are about 0.25 inches in diameter and 0.1 inches high. Such a resonator can achieve very high Q because of its size and lack of metallic losses, and is capable of providing excellent frequency stabilization in the GHz range.

SUMMARY

In general, one aspect of the subject matter described in this specification can be embodied in a microwave cavity resonator stabilized oscillator. The oscillator includes a cavity resonator configured to resonate at least at one predetermined resonant frequency in a GHz frequency range. The oscillator can include circuitry including a microwave amplifier, a low pass filter and a phase shifter. The circuitry may be arranged in a feedback loop configuration with the cavity resonator, and is at least partially mounted above a first surface of the cavity resonator. The circuitry may be electrically coupled to the cavity resonator to form an oscillator. The circuitry may include a first delay line segment selected or chosen over (or instead of) at least one other delay line segments for electrical connection to complete the feedback loop configuration at zero degree phase (e.g., with at least the cavity resonator, the microwave amplifier, the low pass filter and the phase shifter).

In some implementations, the oscillator further includes a directional coupler incorporated in the circuitry or feedback loop configuration.

In some implementations, the cavity resonator is electrically coupled to the circuitry to resonate at a frequency of at least 4 GHz.

In some implementations, the cavity resonator is electrically coupled to the circuitry to resonate at a frequency of between 4 GHz and 100 GHz.

In some implementations, the circuitry is mounted above the first surface of the cavity resonator and within a physical footprint or area of the first surface.

In some implementations, the phase shifter is configured to provide phase adjustments of up to 40 degrees (e.g., between zero and 40 degrees).

In some implementations, the selected first delay line segment is configured to provide phase adjustment of up to 360 degrees (e.g., between zero and 360 degrees).

In some implementations, the first surface includes at least one metallized coupling contact to electrically couple to the circuitry.

In some implementations, the first surface includes a ground plane that provides radio frequency shielding.

Another aspect of the subject matter described in this specification can be embodied in a microwave cavity resonator stabilized oscillator. The oscillator includes a cavity resonator configured to resonate at least at one predetermined resonant frequency in a GHz frequency range. The cavity resonator can include a metallized coupling contact, a ground plane that provides radio frequency shielding, and an isolation region between the metallized coupling contact and the ground plane. The oscillator can include circuitry comprising a microwave amplifier, a low pass filter and a phase shifter. The circuitry may be arranged in a feedback loop configuration, and at least partially mounted above (e.g., on a substrate) or on the first surface of the cavity resonator and electrically coupled to the cavity resonator via at least the metallized coupling contact to form an oscillator. The circuitry may include a first delay line segment that is selected/chosen/picked over (or selected/chosen/picked instead of) at least one other delay line segment for electrical connection to complete the feedback loop configuration at zero degree phase with at least the cavity resonator, the microwave amplifier, the low pass filter and the phase shifter.

In some implementations, the oscillator further includes a directional coupler incorporated in the circuitry or feedback loop configuration.

In some implementations, the cavity resonator is electrically coupled to the circuitry to resonate at a frequency of at least 4 GHz.

In some implementations, the cavity resonator is electrically coupled to the circuitry to resonate at a frequency of between 4 GHz and 100 GHz.

In some implementations, the circuitry is mounted above the first surface of the cavity resonator and within a physical footprint or area or boundary of the first surface.

In some implementations, the phase shifter is configured to provide phase adjustments of up to 40 degrees (e.g., between zero to 40 degrees).

In some implementations, wherein the selected first delay line segment is configured to provide phase adjustment of up to 360 degrees (e.g., between zero to 360 degrees).

Another aspect of the subject matter described in this specification can be embodied in a method for implementing a microwave cavity resonator stabilized oscillator. The method includes providing a cavity resonator configured to resonate at least at one predetermined resonant frequency in a GHz frequency range. The method may include at least partially mounting circuitry above or on a first surface of the cavity resonator. The circuitry may include a microwave amplifier, a low pass filter and a phase shifter. The method may include electrically coupling the circuitry to the cavity resonator to form an oscillator, the circuitry arranged in a feedback loop configuration and further comprising a plurality of delay line segments. The method may include selecting a first delay line segment over (or instead of) at least one other delay line segment for electrical connection to complete the feedback loop configuration at zero degree phase (e.g., with at least the cavity resonator, the microwave amplifier, the low pass filter and the phase shifter).

In some implementations, the method further includes mounting the circuitry above the first surface of the cavity resonator and within a physical footprint/boundary/area of the first surface.

In some implementations, the method further includes tuning the phase shifter to provide phase adjustments of up to 40 degrees (e.g., between zero to 40 degrees), in the feedback loop configuration.

In some implementations, selecting the first delay line segment comprises selecting the first delay line segment to provide phase adjustment of up to 360 degrees (e.g., between zero to 360 degrees), in the feedback loop configuration.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
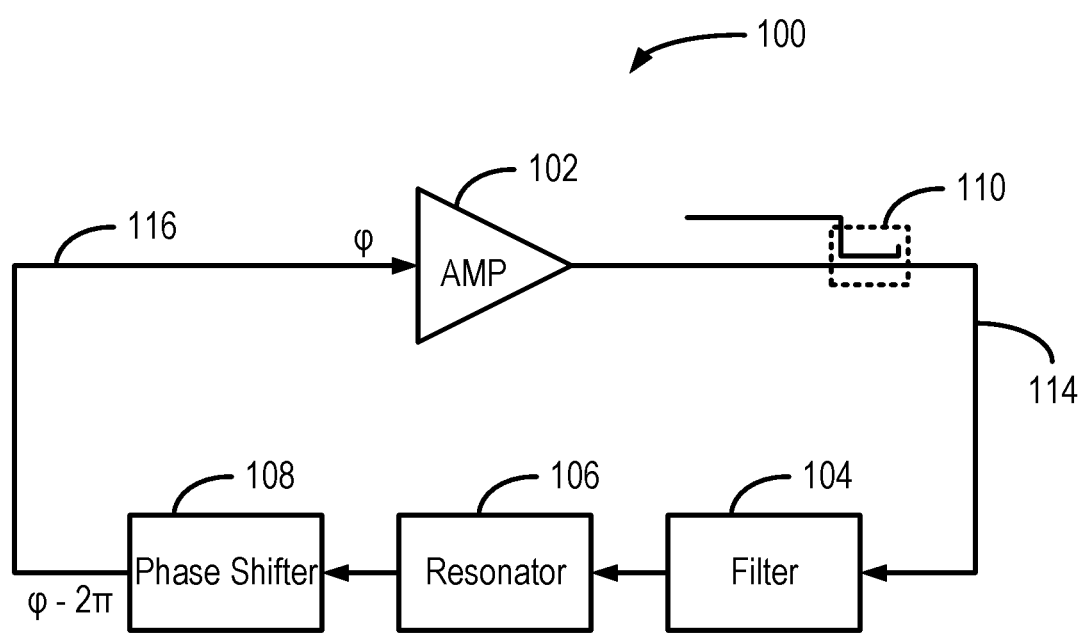
FIG. 1 illustrates a representation of an example microwave voltage controlled oscillator (VCO) in accordance with various implementations.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The following description discusses one or more embodiments of a microwave cavity resonator stabilized oscillator or miniaturized high performance low-phase-noise oscillator for microwave frequencies. The oscillator may utilize or incorporate a cavity resonator as a microwave discrete resonator component with integrally fabricated contacts, e.g., for precision control of electrical coupling to an electrical resonant mode of the cavity. Certain properties of the discrete cavity resonator component can enable the discrete cavity resonator's application as a circuit element in the oscillator circuit. The cavity resonator exterior may be fully or substantially metallized, except for dielectric isolation region(s) that are defined on the upper surface of the metallization. These isolation regions may define coupling contacts on the upper surface of the cavity resonator. The remainder of the metal surface can form a radio frequency (RF) ground contact (ground plane) for the oscillator circuitry, which may be mounted over or above the upper surface of the resonator. Stacking or mounting of constituent elements of the oscillator vertically over the cavity resonator can minimize the physical footprint area or size of the oscillator.

The shielded nature of the cavity resonator can result in the oscillator being un-affected by the surrounding enclosure, in contrast with dielectric resonator oscillators. For example, the effect of microphonic modulation of the oscillator output frequency over phase noise performance of the oscillator in non-stationary applications can be reduced.

As mentioned above, bonding or coupling the constituent circuit and resonator in a vertically stacked configuration can result in a modular design and/or small overall size of the oscillators. In some implementations, all of the supporting components and circuitry can be realized within the outline dimensions of the supporting cavity resonator, providing a mechanically robust assembly that is substantially insensitive to shock and vibration. The oscillator can utilize high dielectric constant temperature stable ceramic substrate materials and thin film patterning for both the cavity resonator and micro-strip circuitry to provide the desired miniaturization and repeat-ability (in manufacturing devices with substantially the same device characteristics) for the electronic circuitry.

FIG. 1 illustrates a representation of an example microwave voltage controlled oscillator (VCO) 100. The microwave VCO 100 can include an amplifier 102, a low pass filter 104, a resonator 106, and a phase shifter 108 arranged in a feedback loop. The output 114 of the amplifier 102 may be fed back as an input 116 to the amplifier after being processed by the low pass filter 104, the resonator 106, and the phase shifter 108. In some embodiments, the amplifier 102, the low pass filter 104, the resonator 106, and the phase shifter 108 shift the phase φ of the input signal 116 such that the difference in phase between the input signal 116 and the output of the phase shifter 108 is about $2n\pi$ radians (or $n \times 360°$), where "n" is a positive integer. As a result, the amplifier 102 input can be fed back to the input of the amplifier 102 with positive feedback, causing the output 114 of the amplifier 102 to oscillate. At steady state, the oscillating frequency of the output signal 114 can be near the resonant frequency of the resonator 106, and one complete traverse of the loop (e.g., starting at the input signal 116 and ending back at the input signal 116) of the VCO 100 will result in $2n\pi$ radians (or $n \times 360°$) phase shift and a loop gain of one (i.e., unity gain).

At least a portion of the phase delay imparted by the feedback loop in the VCO 100 can be implemented using delay lines (not shown). For example, the phase shifter 108 can include programmable delay line arrays, where the total delay provided by the delay line array can be selected using voltage controlled switches. The programmable delay line array can provide selectable increments with which the total delay can be adjusted. For example, in some implementations, the increments can be in the order of a few nanoseconds. By using a programmable delay line, fine adjustments to the total delay can be carried out during operation to ensure that the phase shift provided by the feedback loop is about $2n\pi$ radians (or $n \times 360°$), or in multiples of $2\pi$ radians, including zero degree phase. As a result, any variations in the delay caused by changes in the characteristics of the components of the VCO due to changes in the environmental conditions, such as temperature, can be easily compensated. As discussed further below, a modular design of the VCO can provide the ability to include additional delay lines to also provide coarse delay adjustments. In some implementations, the delay lines can be inserted anywhere within the feedback loop shown in FIG. 1.

Figure 2A:
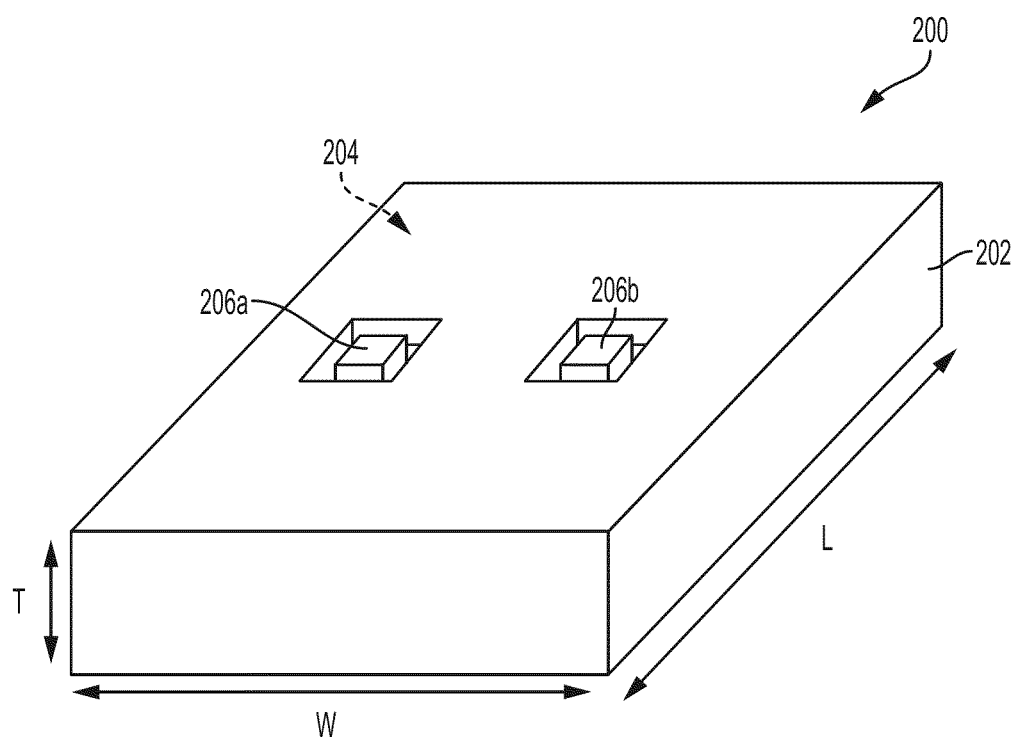
FIG. 2A illustrates an isometric view of a representation of an example cavity resonator in accordance with various implementations.
Figure 2B:
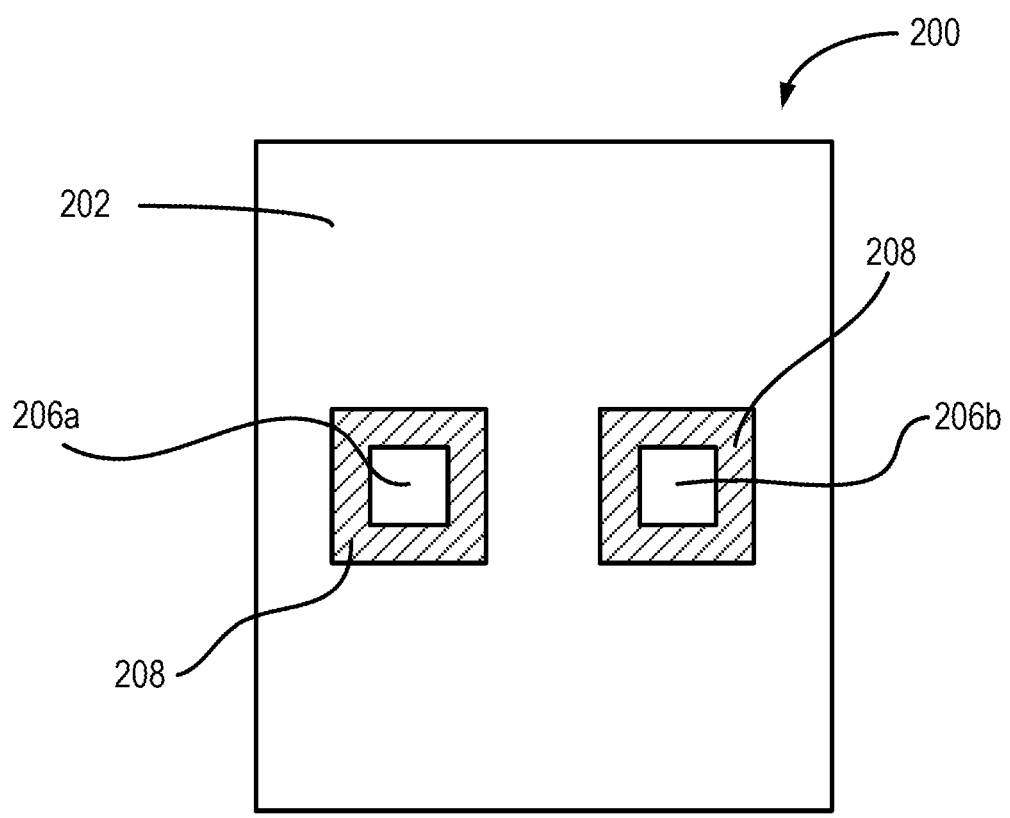
FIG. 2B illustrates a top view of a representation of an example cavity resonator in accordance with various implementations.

FIG. 2A illustrates an isometric view of a representation of an example cavity resonator 200. FIG. 2B illustrates a top view of the representation of the example cavity resonator 200. The cavity resonator 200 can be used, for example, in implementing the resonator 106 in the VCO 100 shown in FIG. 1. The resonator 200 can include a dielectric base 204 that has a width (W), a length (L) that is greater than or equal to the width, a thickness (t) and two, opposed major surfaces. The opposed major surfaces of the dielectric base 204 itself cannot be seen in FIGS. 2A and 2B, because substantially the entire outer surface of the dielectric base 204 is covered by a metal ground coating/layer 202, as discussed herein in more detail. In addition, it should be understood that "W," "L" and "t" in FIG. 2A designate the width, length, and thickness of the underlying dielectric base 2 that is covered by the metal ground coating/layer 202.

Two metal contacts 206a and 206b may be formed on one of the major surfaces of the dielectric base 204 (e.g., the upper surface as shown in FIGS. 2A and 2B), and may be isolated from the metal ground coating 202 by an isolation region 208. The size of an isolation region 208 may be selected to be consistent with desired input impedance between the respective metal contacts 206a/206b and the metal ground coating 202. For example, when the dielectric base 204 is on the order of 0.18 inches (W)×0.18 inches (L), and the device is intended to operate at around 10 GHz, the isolation region 208 can be about 0.01 inches wide.

While the metal material used to form the metal contacts 206a and 206b and metal ground coating 202 is not limited to any one metal, gold, copper and silver are examples of metals that could be used. Metals with high electrical conductivity are desirable for high Q. Superconductor surface metals can be employed to enhance Q.

The thickness of the metal contacts 206a and 206b and the metal ground coating 202 is not particularly limited, but may be at least three "skin depths" thick at the operating frequency for high Q. In the context of a 10 GHz resonator using gold or copper metal, for example, the metal contacts 206a and 206b and metal ground coating 202 may be about 100 micro-inches thick. As the frequency of the device increases, the thickness of metal necessary to enable optimum Q of the device can be decreased.

The dielectric base 204 can be made of any ceramic dielectric material that has a dielectric constant that does not change significantly with temperature. In addition, the dielectric material may have a predictable, homogeneous dielectric constant and a low loss tangent. If the ceramic resonator is to operate in a GHz frequency range, the dielectric constant of the material may typically be less than 100 for temperature stability, and the loss tangent may be less than 0.005, commensurate with the desired resonator Q. Suitable dielectric materials can include fused silica, Al2O3, as well as MgO-based ceramics sold under the trade name CF by Dielectric Laboratories, Inc., for example.

The resonator 200 can be designed to resonate at a variety of predetermined resonant frequencies by using a material that has a dielectric constant of less than 100 and by carefully selecting the width and length of the dielectric base 204. While the resonant frequency may be determined based on the particular application for the resonator, in the context of a resonator that will be used to stabilize the frequency of an oscillator in a telecommunications system, the resonant frequency may be on the order of 1 to 45 GHz. The resonator 200 design of the present disclosure can enable the manufacture of resonators that resonate at any frequency within this entire range by changing the length/width and/or dielectric constant of the dielectric base 204.

In the resonator 200 shown in FIG. 2A, the length (L) of the dielectric base 204 may be greater than the width (W). It may be preferred that W/L ratio be in a range of 0.6 to 1.0. In some embodiments, the largest separation between resonant frequencies and maximum Q is realized for W/L=1.0. The lowest frequency resonant mode of this structure may be the $TE_{101}$ mode, which results in a maximum electric field distribution within the dielectric base 204 in the two-dimensional center of the dielectric base 204. In this way, the coupling between the metal contacts 206a and 206b and the electromagnetic energy within the dielectric base 204 can be controlled by positioning the metal contacts 206a and 206b at selected locations on the dielectric base 204. For example, the coupling between metal contacts 206a and 206b and the electromagnetic energy within the dielectric base 204 can be maximum at the two-dimensional center of the dielectric base 204. In order to increase the loaded Q that the external circuit experiences when connected to the resonator, however, it may be necessary to reduce the coupling between the metal contacts 206a and 206b and the electromagnetic energy. Accordingly, the metal contacts 206a and 206b can be moved away from the geometric center of the dielectric base 204 to reduce coupling. In the device shown in FIGS. 2A and 2B for example, the contacts 206a and 206b may be positioned on either side of a longitudinal center line of the resonator 200, rather than the geometric center of the dielectric base 204. The coupling may be reduced significantly in this manner. In some implementations, the contacts 206a and 206b can be placed proximate to one of the longitudinal ends of the resonator 200.

As explained above, in, high frequency applications, especially in the GHz frequency range, it may be necessary or desired for the resonator 200 to exhibit a high Q of at least 100. In many voltage controlled oscillator (VCO) applications, it may be important, however, that the resonator 200 not exhibit too high a loaded Q, in order to allow sufficient electronic tuning of an oscillator. Specifically, if the resonator has a loaded Q in a range of 100-200, it can provide sufficient frequency stabilization characteristics, but also have enough bandwidth to allow the oscillator to be tuned to some degree around the natural resonant frequency of the resonator. This electronic tunability can enable a group of oscillators to be adjusted to an exact frequency within a prescribed frequency range, thus compensating for oscillator/resonator manufacturing tolerance as well as effects of operating environment, such as temperature and supply voltage.

The loaded Q of the resonator may be defined, in large part, by the degree of coupling between the metal contacts 206a and 206b and the electromagnetic energy within the dielectric base 204. Thus, the amount of coupling can be changed by changing the sizes of the metal contacts 206a and 206b and by changing the positions of the metal contacts 206a and 206b with respect to those areas within the dielectric base 204 where the electromagnetic energy is greatest. Again, as explained above with respect to FIGS. 2A and 2B, in the design of the present resonator, the electromagnetic energy may be greatest in the two-dimensional center of the dielectric base 204, as well as along the longitudinal center line thereof. By selecting the positions of the metal contacts 206a and 206b with respect to these areas of maximum electric field strength, the coupling can be controlled, and thus, the Q of the overall device can be accurately controlled.

In the context of the resonator 200, the Q of the resonator may be easy to control because the size and position of the metal contacts 206a and 206b are established using standard lithographic techniques. As such, any given resonator can be formed to exhibit a very specific Q, which ultimately controls the loaded Q experienced by the external circuit. In addition, the use of lithographic techniques can provide precise control over the size of the isolation regions 208 to dictate the input impedance of the device, which may be desirable when implementing the resonator in different external circuits.

The resonator 200 can provide significant advantages over the resonators currently available. For example, as a single discrete unit, the resonator 200 can provide a relatively high loaded Q that has heretofore been available only with the more complicated (and thus more expensive) resonators discussed above. Secondly, the same basic design can be implemented across a wide variety of applications simply by changing the length width ratio and/or the dielectric constant of the dielectric base 204. The thickness of the dielectric base 204 can be adjusted over a range commensurate with fabrication methods and desired unloaded resonator Q. The Q increases with thickness up to a threshold where the resonator supports the $TE_{111}$ mode as well as the $TE_{101}$ mode (the lowest frequency mode). In addition, the use of lithographic techniques to control the position and size of the metal contact can provide wide latitude in controlling the loaded Q of the resonator to thus satisfy a variety of potential circuit requirements.

The resonator 200 has other advantages over the prior art. For example, if the footprint on the circuit board is pre-defined such that the resonator must fit within that footprint, the dielectric constant of the material used to form the dielectric base 204 can be easily changed to achieve the desired resonant frequency with only a minimal change in the length and width dimensions of the dielectric base 204. In addition, the thickness of the dielectric base 204 can also be varied to contribute to greater control of the Q of the resonator.

Another advantage of the resonator 200 can be that it is self-shielding. Specifically, since the entire outer surface of the dielectric base 204 is covered by the metal ground coating 202, with the exception of the metal contacts 206a and 206b and isolation region 208, the electromagnetic energy within the dielectric base 204 may be confined by the metal coating 202. In some implementations, the metal coating is grounded, and can provide a ground plane to other circuitry mounted on the resonator 200. Accordingly, unlike prior art resonators, it is not necessary to provide an additional housing surrounding the resonator 200 to prevent interference by or with other components of the circuit board on which the resonator will be used. Moreover, the self-shielding feature attributed to the resonator according to the present invention eliminates the dependency of the resonator frequency and Q on the materials within the surrounding shield housing. This can also simplify the design, manufacture and/or testing procedures for products utilizing the resonators.

The above mentioned advantages such as high Q, adjustable footprint, and self-shielding can allow the use of the resonator 200 in a modular VCO design.

Figure 3:
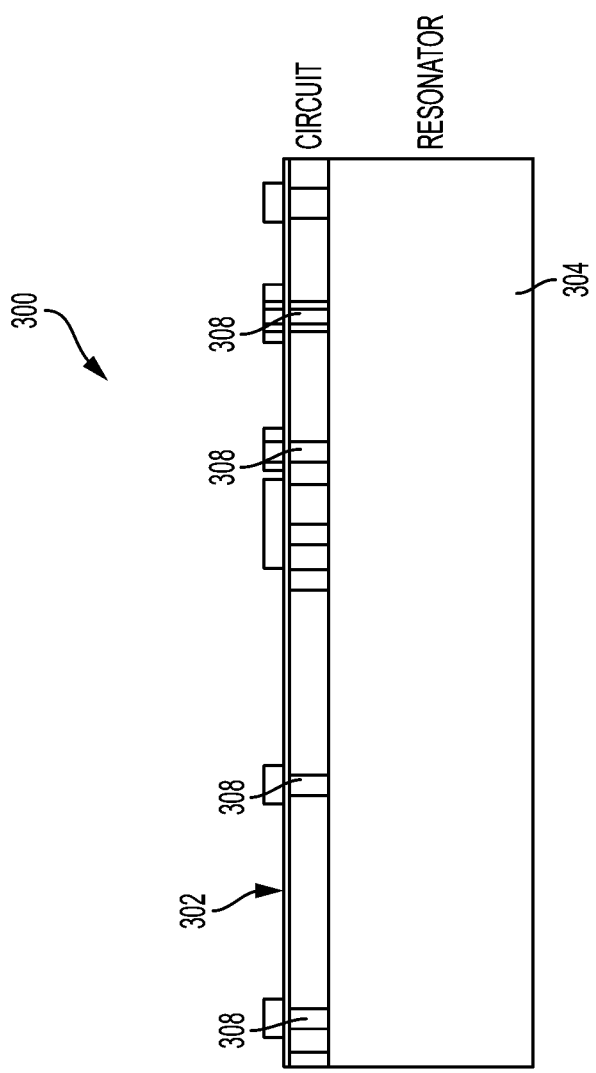
FIG. 3 depicts a side view representation of an example oscillator in accordance with various implementations.

FIG. 3 depicts a side view representation of an example microwave cavity resonator stabilized oscillator or modular VCO 300. The modular VCO can include a circuit board 302 mounted above or over a resonator 304. The circuit board 302 can include circuitry for implementing various components of the VCO, such as for example, the low pass filter 104, the phase shifter 108, the amplifier 102 and/or the coupler 110, discussed above in relation to the VCO 100 shown in FIG. 1. The resonator 304 can be implemented using some or all elements of the resonator 200 discussed above in relation to FIGS. 2A and 2B. The circuit board 302 can include metal contacts 308 that can connect circuit components on the circuit board 302 to metal contacts (such as the metal contacts 206a and 206b shown in FIGS. 2A and 2B) of the resonator 304. The same surface can include a ground plane that provides radio frequency shielding. This ground plane can be considered a metalized contact (for grounding). The circuit board 302 can be mounted on the resonator 304 using a fastener, solder, conductive adhesive, and any other means for forming a bond between the circuit board 302 and the resonator 304. The circuit board 302 can be formed using a dielectric material, such as, for example, a ceramic.

Figure 4:
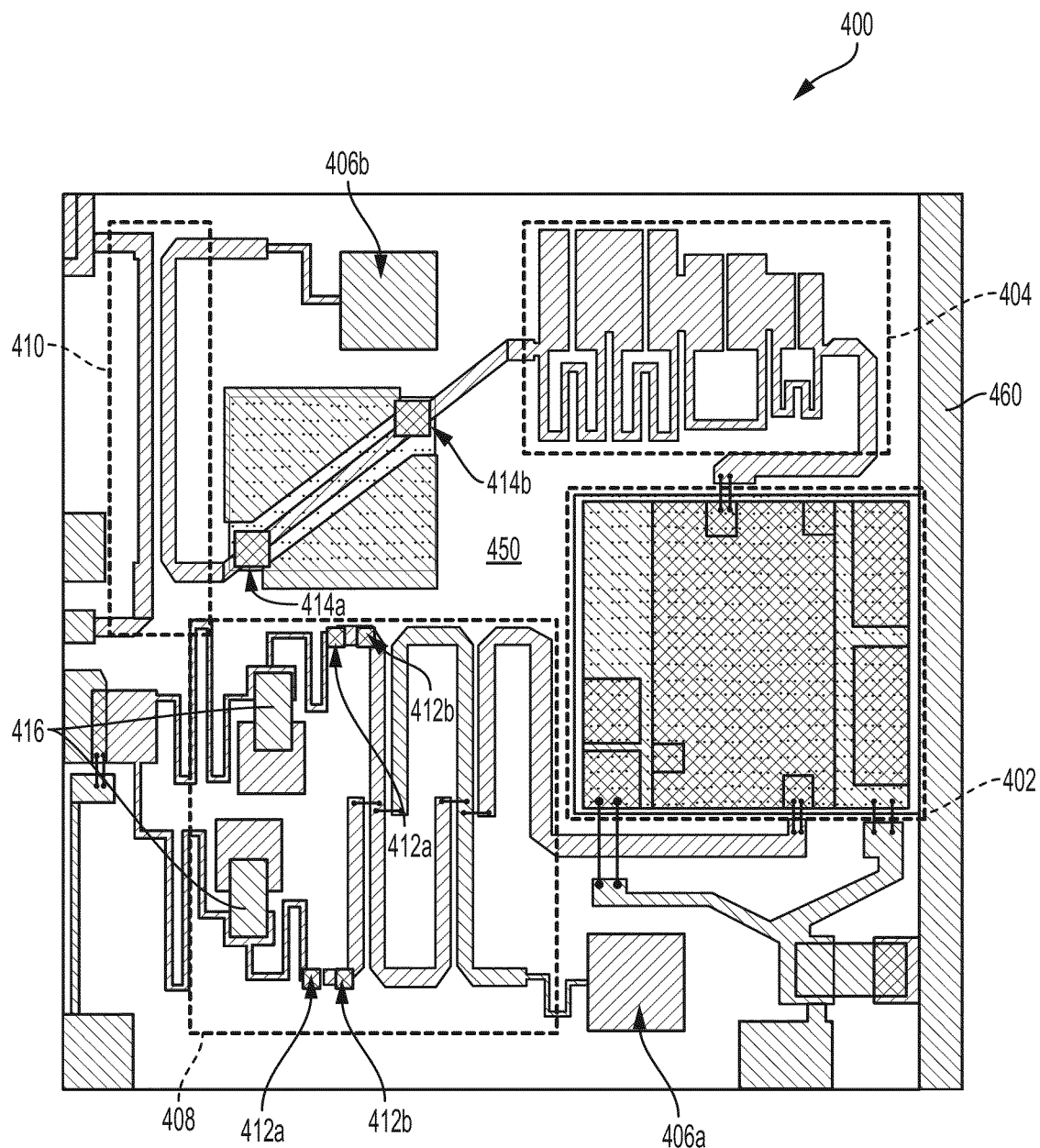
FIG. 4 depicts a top view representation of an example oscillator in accordance with various implementations.

FIG. 4 depicts a top view representation of an example modular VCO 400. The modular VCO 400 can include a circuit board 450 that is mounted over a resonator 460, a portion of which is exposed around the periphery of the circuit board 450. In some implementations, the circuit board 450 can have a footprint that is smaller than a footprint of the surface of the resonator 460 on which the circuit board 450 is disposed. Having a portion of the metal coating of the resonator 460 exposed can allow fine tuning the resonator 460 by etching (such as, for example, using laser etching) a portion of the exposed metal coating. In some implementations, the modular VCO 400 can be used to implement the modular VCO 300 shown in FIG. 3. The modular VCO 400 can include a semiconductor chip such as a monolithic microwave integrated circuit (MMIC) 402, a low pass filter 404, a phase shifter 408 and/or a directional coupler 410. In some implementations, the MMIC 402 can include circuitry to implement an amplifier (e.g., a microwave amplifier), such as the amplifier 102 of the VCO 100 discussed above in relation to FIG. 1. Further, the low pass filter 404 and the phase shifter 408 can be used to implement the low pass filter 104 and the phase shifter 108, respectively, of the VCO 100 discussed above in relation to FIG. 1. The modular VCO 400 can include contacts 406a and 406b that can be connected to metal contacts on the resonator 460. For example, the contacts 406a and 406b can be connected to metal contacts 206a and 206b of the resonator 200 discussed above in relation to FIG. 2. These connections can be made using wire-bonds, or using metal contacts such as the metal contacts 308 discussed above in relation to FIG. 3. The phase shifter 408 can include varactors diodes 416, which for a voltage tunable phase shifter 408 and frequency tuning of the VCO 100.

In some implementations, the phase shifter 408 can include delay lines, such as the programmable delay lines discussed above in relation to VCO 100. The programmable delay lines can provide in operation adjustments of the delay of the feedback loop of the VCO to ensure that the VCO can maintain its oscillating state. For example, in some implementations, the phase shifter 408 can provide phase adjustments of between zero and 40 degrees. In some implementations, where coarse adjustments in the delay are needed, and where the programmable delay line in the phase shifter is unable to provide the desired range of adjustment, additional delay lines can be incorporated into the modular VCO 400. For example, by way of illustration and not intended to be limiting in any way, contact points 412a and 412b may be provided in the phase shifter 408 (or any other portion of the feedback loop) to which an additional delay lines can be connected. For example, FIG. 4 shows two sets of contact points 412a and 412b on each leg of the phase shifter. Two equivalent delay lines (with delay "d") can be added between the two sets of contact points 412a and 412b (to balance the phase shifter) to provide an additional delay "d". In such cases, metal trace (e.g., default or prefabricated delay trace) between the each set of contact points 412a and 412b can be removed such that these two contact points are not electrically connected. Instead the two contact points 412a and 412b can be connected to two ends of an additional delay line, which can be mounted over the circuit board 450. This may be easily implemented given the modular design of the modular VCO 400. In some implementations, contact points 414a and 414b can be provided along a signal trace between the directional coupler 410 and the low pass filter 404. Similar to the technique discussed above in relation to the contact points 412a and 412b, a portion of a conductor between the contact points 414a and 414b can be removed, and the contact points 414a and 414b can be electrically connected to a delay line providing an additional delay "d". This also may be easily implemented given the modular design of the modular VCO 400.

Figure 5:
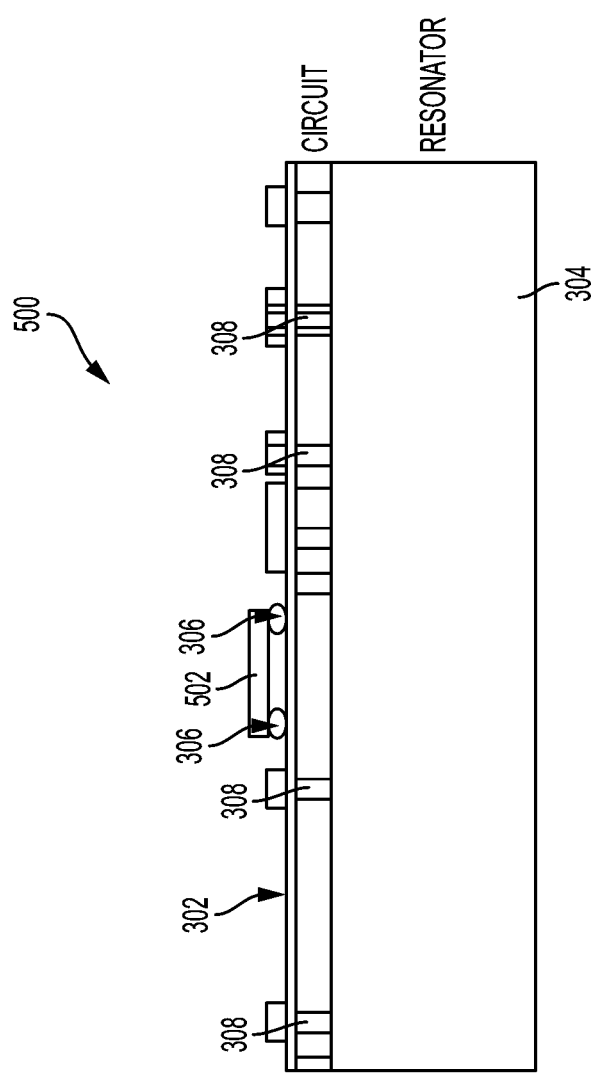
FIG. 5 depicts a side view representation of an example oscillator incorporating a wire-bonded delay line in accordance with various implementations.

For example, FIG. 5 depicts a side view representation of an example modular VCO 500 incorporating an additional delay line 502. The modular VCO 500 shown in FIG. 5 is similar to the modular VCO 300 shown in FIG. 3. However, the modular VCO 500 includes additional delay line(s) 502 disposed over the circuit board 302. The additional delay line 502 can be connected into the VCO 500 by wire bonding, soldering, or any other connecting means. For example, the additional delay line 502 can be connected to the contact points 412a and 412b or the contact points 414a and 414b shown in FIG. 4.

Figure 6:
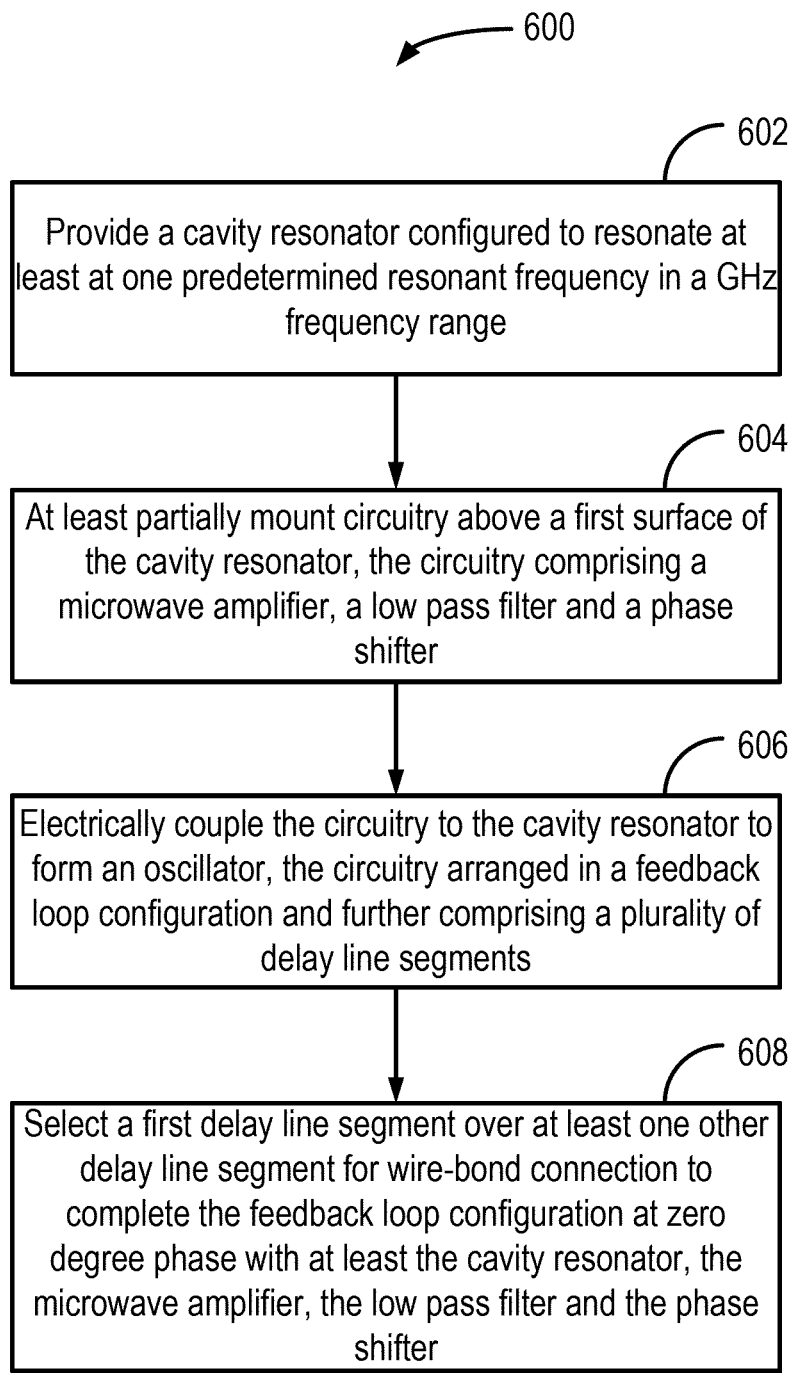
FIG. 6 shows a flow chart of an example process 600 for forming a microwave cavity resonator stabilized oscillator.

FIG. 6 shows a flow chart of an example process 600 for forming a modular voltage controlled oscillator. In particular, the method includes providing a cavity resonator configured to resonate at least at one predetermined resonant frequency in a GHz frequency range (stage 602). At least one example of this process stage has been discussed above in relation to FIGS. 1-5. For example, FIG. 2 shows a cavity resonator 200 that can resonate in GHz frequency range of about 2 GHz to about 10 GHz. In some embodiments, the cavity resonator may be electrically coupled to the circuitry to resonate at a frequency of at least 4 GHz (e.g., 5-20 GHz, or 40-80 GHz). For instance, resonators can be built in smaller sizes to operate at 60 GHz. In certain embodiments, the cavity resonator is electrically coupled to the circuitry to resonate at a frequency of between 4 GHz and 100 GHz.

The cavity resonator may operate like a narrow band pass filter because of high Q. The cavity resonator may comprise a metallized rectangular structure with contact points. This is in contrast with circular ceramic puck type resonators that are not metallized, which use proximity coupling rather than conductive contacts for coupling to additional circuitry. The latter may operate in band-stop mode that produces a high reflection coefficient at high Q.

The process 600 can includes at least partially mounting circuitry above a first surface of the cavity resonator, the circuitry incorporating a microwave amplifier, a low pass filter and/or a phase shifter (stage 604). In some embodiments, the circuitry may include a directional coupler or power divider. The circuitry may be fabricated on a dielectric substrate, such as a ceramic, for example, that is held or stacked over the first surface via support posts or connectors or a conductive adhesive. At least one example of this process stage has been discussed above in relation to FIGS. 1-5. For example, as shown in FIGS. 3 and 5, a circuit board 302 is mounted over a top surface of the resonator 304. As shown in FIG. 4, the circuit board 302 can include an MMIC 402 including an amplifier, a low pass filter 404, and a phase shifter 408.

The process 600 may include electrically coupling the circuitry to the cavity resonator to form an oscillator, the circuitry arranged in a feedback loop configuration (stage 606). Depending on the application, operating conditions (e.g., operating resonator/oscillator frequency, variation in process or insertion phase of various components across production batches for instance, variation/drift in temperature, frequency drift in a phase locked loop of the circuitry) and/or design of the oscillator, certain aspects of the oscillator circuitry may have to be altered, customized, tunable or configured to be operational. For instance, some of the stated effects can cause a 10-15 degree phase shift in the feedback loop configuration for instance. For example, to achieve zero degree phase or multiples of $2\pi$ degree phase in the feedback loop configuration, phase adjustment may be required, e.g., using the phase shifter and/or delay line segment(s).

The process 600 may include identifying, selecting, choosing, picking, incorporating and/or using a first delay line segment instead of at least one other available delay line segment, for wire-bond connection to complete the feedback loop configuration at zero degree phase or multiples of $2\pi$ degree phase (e.g., with at least the cavity resonator, the microwave amplifier, the low pass filter and the phase shifter) (stage 608). At least one example of this process stage has been discussed above in relation to FIGS. 1-5. For example, contacts 412*a* and 412*b* can be used to connect a delay line 502 to a feedback loop. As discussed above in relation to FIG. 1, a resonator 106, the amplifier 102, the low pass filter 104 and the phase shifter 108 are connected in the feedback loop. Further, as discussed in relation to FIGS. 4 and 5, the phase shifter 408 can include a number of delay lines that can additionally provide adjustments for a desired phase shift.

In some embodiments, a plurality of delay line segments may be designed and/or made available for optional coupling into the feedback loop. Such delay line segments may be wire-bond tunable, by connecting one(s) with specific phase delay(s) into the feedback loop configuration. The circuitry may include or incorporate one or more of the plurality of available delay line segments. Each of the delay line segments may be configured to provide a different phase delay. Each of the delay line segments may be matched with or customized to operate with a particular oscillator frequency, to provide a fixed offset phase. By selecting from different available delay line segments, the provided phase offset can be adjustable, such that a large phase shifter (with a correspondingly large electronically tunable phase adjustment) is not necessary, to achieve resonance peak in the cavity resonator. Such an implementation may result in a more compact design. For instance, the phase shifter incorporated into the feedback loop can be configured to provide phase adjustments of up to 40 degrees (instead of larger phase adjustments). An additional delay line segment can be selected to provide the bulk of the required phase adjustment, e.g., of up to 360 degrees.

In some embodiments, a default or prefabricated delay line segment is incorporated into the feedback loop, and may be removed and replaceable with another delay line segment to achieve zero degree phase or multiples of $2\pi$ degree phase. For example, a default line segment may be printed into the circuitry, which can be removed and replaced if it is not able to provide enough phase shift for a particular implementation.

In certain embodiments, a number of delay line segments may be prefabricated or printed as part of the circuitry, one or more of which can be selected for connection into the feedback loop configuration, while one or more other delay line segments may be left disconnected, grounded or floating, apart from the feedback loop configuration. It is however possible to shrink the oscillator assembly if we can avoid printing the various line segments on the circuit, since the printed line segments are implemented at same dielectric constant as the rest of the printed circuitry and may not be optimally sized. In contrast, off-circuitry line segments that are selectable for wire-bonding to the circuitry can be components of higher dielectric constant than the main circuit board feedback loop elements, which enables such line segments to be more compact in size while providing a particular phase delay. For instance, primary circuitry components may have a dielectric constant of 13, whereas selectable line segments of a higher dielectric constant (e.g., Magnesium oxide, at 23) can be used.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microwave cavity resonator stabilized oscillator, comprising:
   a cavity resonator configured to resonate at least at one predetermined resonant frequency in a GHz frequency range; and
   circuitry comprising a microwave amplifier, a low pass filter, a directional coupler and a phase shifter, the low pass filter positioned to receive an output of the microwave amplifier and provide a filtered output to the directional coupler, the circuitry arranged in a feedback loop configuration with the cavity resonator, the circuitry at least partially mounted above a first surface of the cavity resonator and electrically coupled to the cavity resonator to form an oscillator, the circuitry further comprising a first delay line segment that is selected instead of at least one other delay line segment for electrical connection to complete the feedback loop configuration at zero degree phase.

2. The microwave cavity resonator stabilized oscillator of claim 1, wherein the cavity resonator is electrically coupled to the circuitry to resonate at a frequency of at least 4 GHz.

3. The microwave cavity resonator stabilized oscillator of claim 2, wherein the cavity resonator is electrically coupled to the circuitry to resonate at a frequency of between 4 GHz and 100 GHz.

4. The microwave cavity resonator stabilized oscillator of claim 1, wherein the circuitry is mounted above the first surface of the cavity resonator and is within a physical footprint of the first surface.

5. The microwave cavity resonator stabilized oscillator of claim 1, wherein the phase shifter is configured to provide phase adjustments of between zero and 40 degrees.

6. The microwave cavity resonator stabilized oscillator of claim 1, wherein the selected first delay line segment is configured to provide phase adjustment of between zero and 360 degrees.

7. The microwave cavity resonator stabilized oscillator of claim 1, wherein the first surface includes at least one metallized coupling contact to electrically couple to the circuitry.

8. The microwave cavity resonator stabilized oscillator of claim 1, wherein the first surface includes a ground plane that provides radio frequency shielding.

9. The microwave cavity resonator stabilized oscillator of claim 1, wherein the circuitry is formed on a temperature stable ceramic material.

10. A microwave cavity resonator stabilized oscillator, comprising:
    a cavity resonator configured to resonate at least at one predetermined resonant frequency in a GHz frequency range, the cavity resonator having a first surface that includes:
      a metallized coupling contact,
      a ground plane that provides radio frequency shielding, and
      an isolation region between the metallized coupling contact and the ground plane; and
    circuitry comprising a microwave amplifier, a low pass filter, a directional coupler and a phase shifter, the low pass filter positioned to receive an output of the microwave amplifier and provide a filtered output to the directional coupler, the circuitry arranged in a feedback loop configuration with the cavity resonator, the circuitry at least partially mounted above the first surface of the cavity resonator and electrically coupled to the cavity resonator via at least the metallized coupling contact to form an oscillator, the circuitry further comprising a first delay line segment that is selected instead of at least one other delay line segments for electrical connection to complete the feedback loop configuration at zero degree phase.

11. The microwave cavity resonator stabilized oscillator of claim 10, wherein the cavity resonator is electrically coupled to the circuitry to resonate at a frequency of at least 4 GHz.

12. The microwave cavity resonator stabilized oscillator of claim 11, wherein the cavity resonator is electrically coupled to the circuitry to resonate at a frequency of between 4 GHz and 100 GHz.

13. The microwave cavity resonator stabilized oscillator of claim 10, wherein the circuitry is mounted above the first surface of the cavity resonator and within a physical footprint of the first surface.

14. The microwave cavity resonator stabilized oscillator of claim 10, wherein the phase shifter is configured to provide phase adjustments of between zero and 40 degrees.

15. The microwave cavity resonator stabilized oscillator of claim 10, wherein the selected first delay line segment is configured to provide phase adjustment of between zero and 360 degrees.

16. The microwave cavity resonator stabilized oscillator of claim 10, wherein the circuitry is formed on a temperature stable ceramic material.

17. A method for implementing a microwave cavity resonator stabilized oscillator, the method comprising:

providing a cavity resonator configured to resonate at least at one predetermined resonant frequency in a GHz frequency range;

at least partially mounting circuitry above a first surface of the cavity resonator, the circuitry comprising a microwave amplifier, a low pass filter, a directional coupler and a phase shifter, the low pass filter positioned to receive an output of the microwave amplifier and provide a filtered output to the directional coupler;

electrically coupling the circuitry to the cavity resonator to form an oscillator, the circuitry arranged in a feedback loop configuration with the cavity resonator and further comprising a plurality of delay line segments; and selecting a first delay line segment instead of at least one other delay line segment for electrical connection to complete the feedback loop configuration at zero degree phase.

18. The method of claim 17, further comprising mounting the circuitry above the first surface of the cavity resonator and within a physical footprint of the first surface.

19. The method of claim 17, further comprising tuning the phase shifter to provide phase adjustments of between zero and 40 degrees in the feedback loop configuration.

20. The method of claim 17, wherein selecting the first delay line segment comprises selecting the first delay line segment to provide phase adjustment of between zero and 360 degrees in the feedback loop configuration.

* * * * *